US008823002B2

(12) United States Patent
Takei et al.

(10) Patent No.: US 8,823,002 B2
(45) Date of Patent: Sep. 2, 2014

(54) METHOD FOR MANUFACTURING SEMICONDUCTOR DEVICE, SEMICONDUCTOR DEVICE, AND DISPLAY DEVICE

(75) Inventors: Michiko Takei, Osaka (JP); Tohru Okabe, Osaka (JP); Tetsuya Aita, Osaka (JP); Tsuyoshi Inoue, Osaka (JP); Yoshiyuki Harumoto, Osaka (JP); Takeshi Yaneda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 74 days.

(21) Appl. No.: 13/510,315

(22) PCT Filed: Aug. 23, 2010

(86) PCT No.: PCT/JP2010/064178

§ 371 (c)(1),
(2), (4) Date: May 25, 2012

(87) PCT Pub. No.: WO2011/061978

PCT Pub. Date: May 26, 2011

(65) Prior Publication Data

US 2012/0228621 A1 Sep. 13, 2012

(30) Foreign Application Priority Data

Nov. 19, 2009 (JP) ................. 2009-264319

(51) Int. Cl.
*H01L 31/036* (2006.01)
*H01L 21/268* (2006.01)
*H01L 27/12* (2006.01)
*H01L 29/66* (2006.01)
*H01L 29/786* (2006.01)
*H01L 29/04* (2006.01)

(52) U.S. Cl.
CPC .......... *H01L 21/268* (2013.01); *H01L 27/1229* (2013.01); *H01L 29/66765* (2013.01); *H01L 29/04* (2013.01); *H01L 27/1285* (2013.01); *H01L 29/78678* (2013.01)
USPC ................. 257/59; 257/57; 257/72

(58) Field of Classification Search
CPC .................................... H01L 29/4908
USPC ................. 257/57, 59, 72
See application file for complete search history.

(56) References Cited

U.S. PATENT DOCUMENTS

| 5,481,121 | A | 1/1996 | Zhang et al. | |
| 6,965,122 | B2 * | 11/2005 | Suzuki et al. | 257/72 |
| 2011/0254068 | A1 * | 10/2011 | Kitakado et al. | 257/296 |

FOREIGN PATENT DOCUMENTS

| JP | 05-063196 A | 3/1993 |
| JP | 07-074366 A | 3/1995 |

(Continued)

OTHER PUBLICATIONS

Official Communication issued in International Patent Application No. PCT/JP2010/064178, mailed on Nov. 22, 2010.

(Continued)

*Primary Examiner* — Samuel Gebremariam
(74) *Attorney, Agent, or Firm* — Keating & Bennett, LLP

(57) ABSTRACT

An object of this invention is to provide a semiconductor device in which TFTs with high mobility are arranged in both of display and peripheral circuit areas. A semiconductor device fabricating method according to the present invention includes the steps of: irradiating an amorphous silicon layer (34) with energy, thereby obtaining a microcrystalline silicon layer; and forming a doped semiconductor layer (35) on the amorphous silicon layer (34). In the step of irradiating, the amorphous silicon layer (34) is irradiated with energy that has a first quantity, thereby forming a first microcrystalline silicon layer (34A) including a channel layer for a first TFT (30A), and is also irradiated with energy that has a second quantity, which is larger than the first quantity, thereby forming a second microcrystalline silicon layer (34B) including a channel layer for a second TFT (30B).

17 Claims, 7 Drawing Sheets

(56) References Cited

FOREIGN PATENT DOCUMENTS

| | | |
|---|---|---|
| JP | 09-266316 A | 10/1997 |
| JP | 2002-043331 A | 2/2002 |
| JP | 2009-075523 A | 4/2009 |

OTHER PUBLICATIONS

English translation of Official Communication issued in corresponding International Application PCT/JP2010/064178, mailed on Jun. 21, 2012.

* cited by examiner

FIG.5
(a)
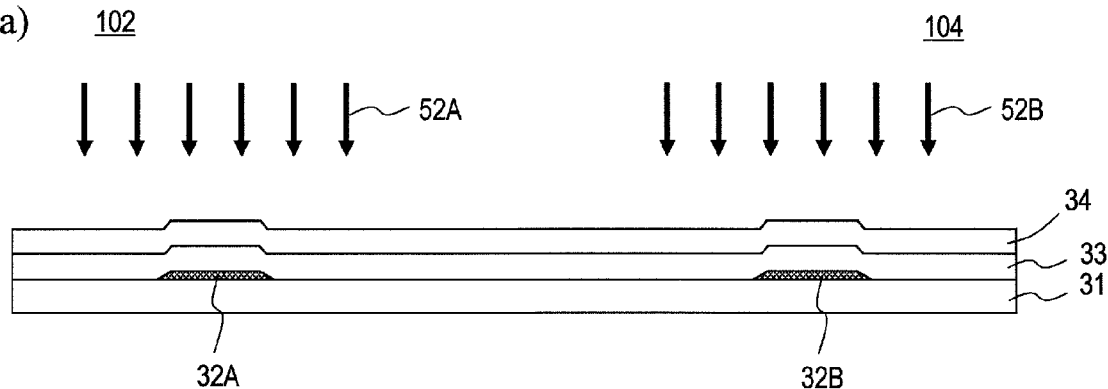
(b)
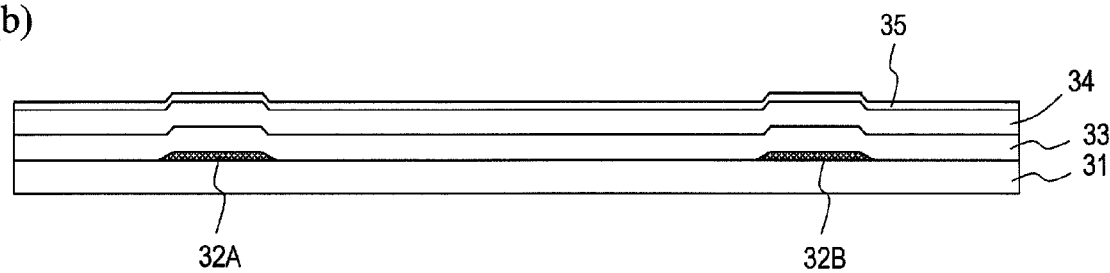
(c)
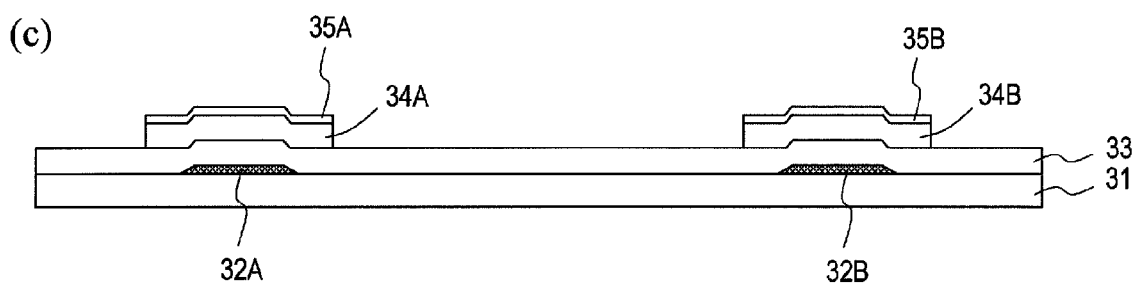
(d)
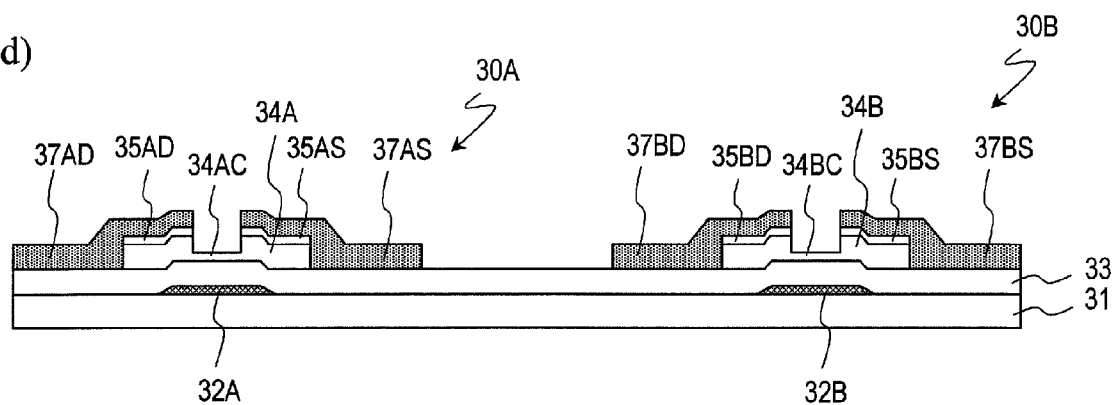

METHOD FOR MANUFACTURING SEMICONDUCTOR DEVICE, SEMICONDUCTOR DEVICE, AND DISPLAY DEVICE

TECHNICAL FIELD

The present invention relates to a semiconductor device including a thin-film transistor (TFT). The present invention also relates to a thin-film transistor for use in a display device such as a liquid crystal display device or an organic EL display device and further relates to a display device including such a thin-film transistor.

BACKGROUND ART

As TFTs (thin-film transistors) for the active-matrix substrate of a display device such as a liquid crystal display device, amorphous silicon TFTs or polysilicon TFTs have been used, for example.

As an amorphous silicon film can be formed relatively easily, amorphous silicon TFTs can be used effectively as TFTs for a display device that needs to have a huge monitor screen. Thus, amorphous silicon TFTs are often used in the active-matrix substrate of a liquid crystal TV with a big monitor screen.

On the other hand, in a polysilicon TFT, electrons and holes have high mobility in its semiconductor layer and a large amount of OFF-state current flows through it. That is why the polysilicon TFT can charge the pixel capacitor of a liquid crystal display device and other devices in a short switching time, which is one of the advantages of the polysilicon TFT. In addition, with polysilicon TFTs, part or even all of a driver and other peripheral circuits can form an integral part of the active-matrix substrate, which is also beneficial.

A bottom-gate-type polysilicon TFT with an inverted staggered structure is disclosed in Patent Document No. 1. The semiconductor layer of that TFT has a multilayer structure in which a polysilicon film obtained by irradiating amorphous silicon with a laser beam, a hydrogenated amorphous silicon film and an n-type silicon film are stacked one upon the other. Patent Document No. 1 also discloses a semiconductor substrate on which a display area and peripheral circuits including drivers are integrated together. In that semiconductor substrate, a semiconductor layer that includes the hydrogenated silicon film but does not include the polysilicon film is used for TFTs in the display area, and a semiconductor layer that includes both the polysilicon film and the hydrogenated amorphous silicon film is used for TFTs that form the peripheral circuits such as drivers.

Patent Documents Nos. 2 and 3 disclose a semiconductor device in which a top-gate TFT with a staggered structure has been fabricated on a substrate. In that semiconductor device, TFTs in the display area (i.e., in pixel regions) have a crystallized silicon film obtained by crystallizing amorphous silicon vertically (i.e., perpendicularly to the surface of the substrate), while TFTs in the peripheral circuit area that surrounds the pixels have a crystallized silicon film obtained by crystallizing amorphous silicon laterally. As a result, according to those patent documents, a semiconductor device including TFTs with a small OFF-state current in the display area and TFTs with high mobility in the peripheral circuit area should be obtained.

Citation List

Patent Literature

Patent Document No. 1: Japanese Laid-Open Patent Publication No. 5-63196

Patent Document No. 2: Japanese Laid-Open Patent Publication No. 7-74366

Patent Document No. 1: Japanese Laid-Open Patent Publication No. 2002-43331

SUMMARY OF INVENTION

Technical Problem

According to Patent Document No. 1, a semiconductor device, in which bottom-gate TFTs are arranged in the display area and the peripheral circuit area, can obtained. Compared to the top-gate TFTs as disclosed in Patent Documents Nos. 2 and 3, the bottom-gate TFTs can be fabricated through a simplified manufacturing process, which is certainly advantageous. In the semiconductor device of Patent Document No. 1, however, the TFTs in the display area have a channel layer that is made of hydrogenated amorphous silicon, and therefore, have a field effect mobility of as small as about 0.5 $cm^2/V \cdot s$. That is why if that semiconductor device is used to make a liquid crystal display device, for example, it is difficult to realize good enough display performance, which is a problem.

It is therefore an object of the present invention to overcome such a problem by providing a semiconductor device in which high-performance inverted-staggered TFTs with high mobility are arranged in both of the display section and peripheral circuit section with the productivity increased.

Solution to Problem

A semiconductor device fabricating method according to the present invention is a method for fabricating a semiconductor device that includes first and second TFTs that have been formed in first and second areas, respectively. The method includes the steps of: forming respective gate electrodes for the first and second TFTs; depositing an insulating layer to cover the gate electrodes; forming a semiconductor layer on the insulating layer; and forming respective source and drain electrodes for the first and second TFTs on the semiconductor layer. The step of forming the semiconductor layer includes the steps of: depositing an amorphous silicon layer on the insulating layer; irradiating the amorphous silicon layer with energy, thereby obtaining a microcrystalline silicon layer; and forming a doped semiconductor layer on the amorphous silicon layer. In the step of irradiating, a portion of the amorphous silicon layer in the first area is irradiated with energy that has a first quantity per unit area (1 $cm^2$), thereby forming a first microcrystalline silicon layer including the channel layer of the first TFT, while a portion of the amorphous silicon layer in the second area is irradiated with energy that has a second quantity, which is larger than the first quantity, per unit area, thereby forming a second microcrystalline silicon layer including the channel layer of the second TFT.

In one embodiment, the first quantity is within the range of 220 $mJ/cm^2$ to 260 $mJ/cm^2$ and the second quantity is within the range of 330 $mJ/cm^2$ to 360 $mJ/cm^2$.

In one embodiment, the step of irradiating includes forming a first microcrystalline silicon layer that has a mobility of 1 $cm^2/Vs$ to 5 $cm^2/Vs$ and a second microcrystalline silicon layer that has a mobility of 10 $cm^2/Vs$ or more.

In one embodiment, the step of irradiating includes irradiating the amorphous silicon layer with energy so that the average grain size of crystal grains included in the second microcrystalline silicon layer becomes larger than the average grain size of crystal grains included in the first microcrystalline silicon layer.

In one embodiment, the step of irradiating includes irradiating the amorphous silicon layer with energy so that crystal grains included in the first microcrystalline silicon layer have an average grain size of less than 1 nm and that crystal grains included in the second microcrystalline silicon layer have an average grain size of 1 nm to 10 nm.

In one embodiment, the step of forming the semiconductor layer includes defining respective channel layers with a thickness of 50 nm or less for the first and second TFTs.

In one embodiment, the amorphous silicon layer has a thickness of 150 nm or less.

In one embodiment, the step of forming the semiconductor layer includes, after the step of irradiating, the steps of: depositing a second amorphous silicon layer on the microcrystalline silicon layer; and forming the doped semiconductor layer on the second amorphous silicon layer.

In one embodiment, the step of irradiating includes irradiating respective portions of the amorphous silicon layer in the first and second areas with a laser beam as the energy.

In one embodiment, the first area is a display area including a number of pixels and the second area is a peripheral area that surrounds the display area and that includes a semiconductor circuit. The first TFT is provided as a TFT for one of the pixels in the display area and the second TFT is provided as a TFT for the semiconductor circuit in the peripheral area.

A semiconductor device according to the present invention has first and second TFTs, and includes: first and second gate electrodes that are provided for the first and second TFTs, respectively; an insulating layer that has been formed to cover the first and second gate electrodes; first and second semiconductor layers that have been formed on the insulating layer for the first and second TFTs, respectively; a first source contact layer and a first drain contact layer that have been formed on the first semiconductor layer; a second source contact layer and a second drain contact layer that have been formed on the second semiconductor layer; a first source electrode and a first drain electrode that have been formed on the first source contact layer and the first drain contact layer, respectively; and a second source electrode and a second drain electrode that have been formed on the second source contact layer and the second drain contact layer, respectively. The first semiconductor layer includes a first channel layer made of microcrystalline silicon and the second semiconductor layer includes a second channel layer made of microcrystalline silicon. The average grain size of crystal grains included in the second channel layer is larger than the average grain size of crystal grains included in the first channel layer.

In one embodiment, the crystal grains included in the first channel layer have an average grain size of less than 1 nm and the crystal grains included in the second channel layer have an average grain size of 1 nm to 10 nm.

In one embodiment, the first channel layer has a mobility of 1 $cm^2$/Vs to 5 $cm^2$/Vs and the second channel layer has a mobility of 10 $cm^2$/Vs or more.

In one embodiment, the channel layers included in the first and second semiconductor layers have a thickness of 50 nm or less.

In one embodiment, the first and second semiconductor layers have a thickness of 150 nm or less.

In one embodiment, the semiconductor device has a display area including a number of pixels and a peripheral area that surrounds the display area and that includes a semiconductor circuit. The first TFT is provided as a TFT for one of the pixels in the display area and the second TFT is provided as a TFT for the semiconductor circuit in the peripheral area.

A display device according to the present invention includes a semiconductor device according to any of the embodiments of the present invention described above.

A display device according to the present invention does not have to be implemented as a liquid crystal display device but may also as any other kind of display device such as an organic EL (electroluminescence) display device and an image capture device.

Advantageous Effects of Invention

The present invention provides a semiconductor device in which high-performance inverted-staggered TFTs with high mobility are arranged in both of the display section and peripheral circuit section and also provide a display device including such a semiconductor device with increased productivity.

BRIEF DESCRIPTION OF DRAWINGS

[FIGS. 5] (a) through (d) are cross-sectional views illustrating respective manufacturing process steps to fabricate the semiconductor device 100.

DESCRIPTION OF EMBODIMENTS

Hereinafter, embodiments of a liquid crystal display device, semiconductor device, TFT, and methods for fabricating the semiconductor device and the TFT according to the present invention will be described with reference to the accompanying drawings. However, the present invention is in no way limited to the specific embodiments to be described below.

(Embodiment 1)

Figure 1:
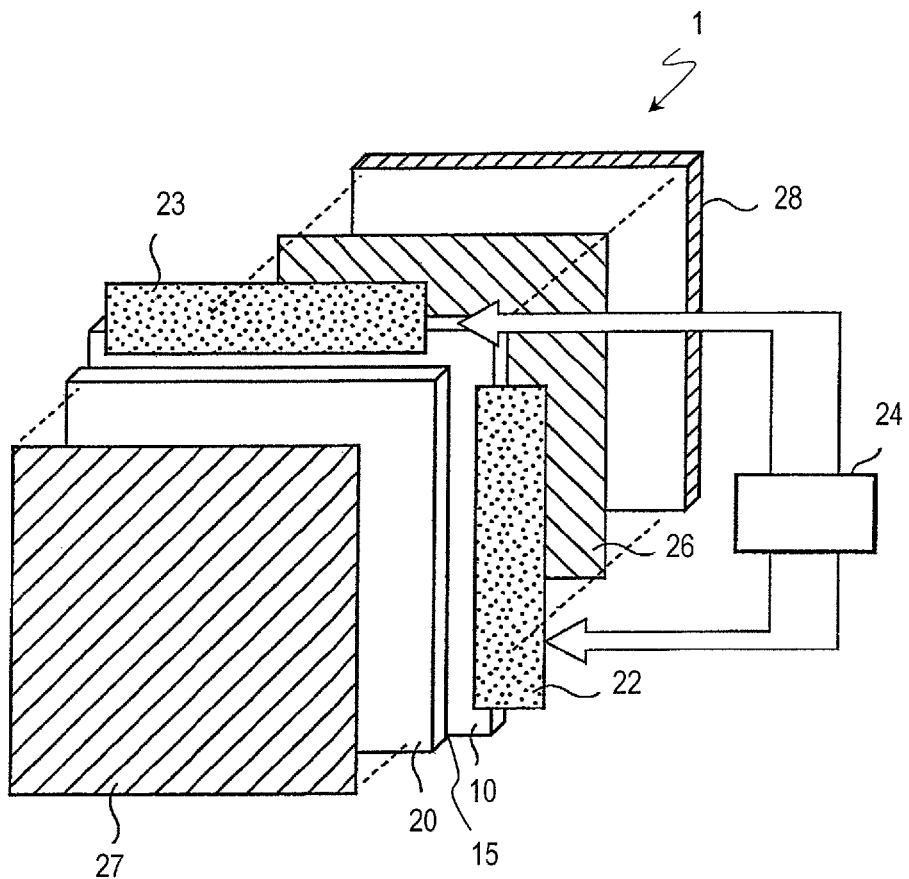
[FIG. 1] A perspective view schematically illustrating a configuration for a liquid crystal display device 1 as an embodiment of the present invention.
Figure 2:
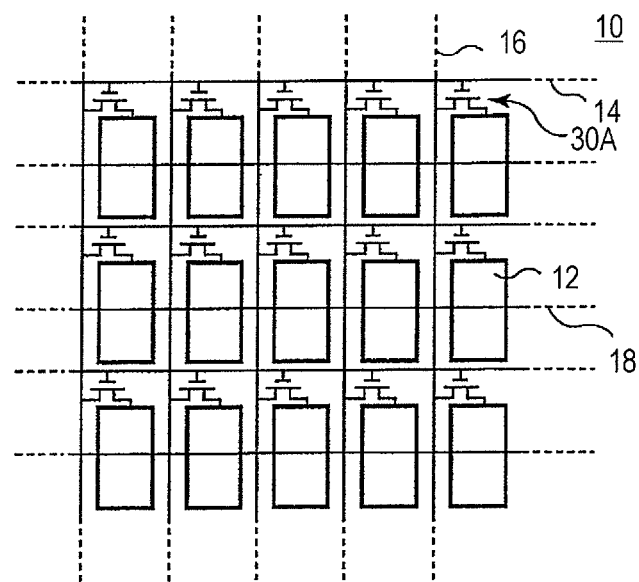
[FIG. 2] A plan view schematically illustrating a configuration for the TFT substrate 10 of the liquid crystal display device 1.

FIG. 1 is a perspective view schematically illustrating a configuration for a liquid crystal display device 1 as a first embodiment of the present invention. FIG. 2 is a plan view schematically illustrating the configuration of the TFT substrate 10 of the liquid crystal display device 1.

As shown in FIG. 1, the liquid crystal display device 1 includes a TFT substrate 10 and a counter substrate (CF substrate) 20 that face each other with a liquid crystal layer 15 interposed between them, two polarizers 26 and 27 that are arranged outside of the TFT substrate 10 and the counter substrate 20, respectively, and a backlight unit 28 that emits light for display toward the polarizer 26.

As shown in FIG. 2, on the TFT substrate 10, a number of scan lines (gate bus lines) 14 and a number of signal lines (data bus lines) 16 are arranged so as to intersect with each other at right angles. Near each of the intersections between the scan lines 14 and the signal lines 16, a TFT 30A is provided as an active component for each pixel. In this example, a single pixel is defined to be an area that is surrounded with two adjacent scan lines 14 and two adjacent signal lines 16. Each pixel is provided with a pixel electrode 12, which is electrically connected to the drain electrode of its associated TFT 30A and which is made of ITO (indium tin oxide), for example. A storage capacitor line (which will also be referred to herein as an "auxiliary capacitor line" or a "Cs line") is arranged between two adjacent scan lines 14 to run parallel to those scan lines 14.

Those scan lines 14 and signal lines 16 are respectively connected to the scan line driver 22 and signal line driver 23 shown in FIG. 1, both of which are connected to a controller 24. And under the control of the controller 24, the scan line driver 22 supplies a scan signal, which changes the ON and OFF states of the TFTs 30A, to the scan lines 14, and the signal line driver 23 supplies a display signal (i.e., a voltage applied to the pixel electrodes 12) to the signal lines 16.

The counter substrate 20 includes color filters and a common electrode. If a display operation is conducted in the three primary colors, the color filters include R (red), G (green) and B (blue) color filters, each of which is arranged to face an associated one of the pixels. The common electrode is arranged to cover the pixel electrodes 12. And the potential difference created between the common electrode and each pixel electrode 12 induces alignment of liquid crystal molecules between those electrodes on a pixel-by-pixel basis, thereby carrying out a display operation.

Figure 3:
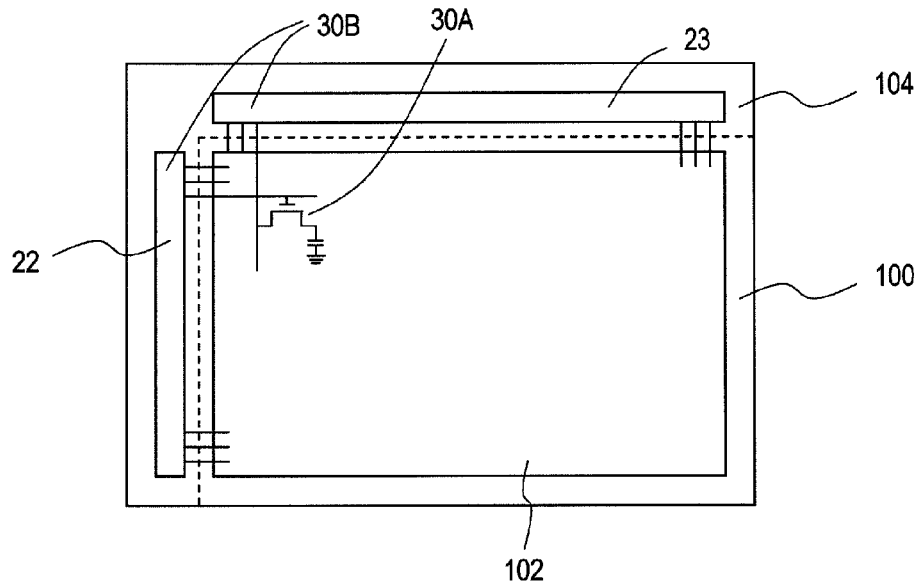
[FIG. 3] A plan view schematically illustrating the configuration of a semiconductor device 100 as a first embodiment of the present invention.

FIG. 3 is a plan view schematically illustrating the configuration of a semiconductor device 100 as a first embodiment of the present invention.

As shown in FIG. 3, the semiconductor device 100 has a display area 102 (which will also be referred to herein as a "pixel area") and a peripheral area 104 (which will also be referred to herein as a "circuit area"). The semiconductor device 100 may have either the same substrate as the TFT substrate 10 or a substrate including the TFT substrate 10. In the display area 102, arranged are the pixel electrodes 12, TFTs 30A (which will be referred to herein as "TFTs of a first type"), scan lines 14, signal lines 16 and storage capacitor lines 18 shown in FIG. 2. On the other hand, in the peripheral area 104, arranged are the scan line driver 22 and the signal line driver 23. In some cases, the controller 24 may be arranged in the peripheral area 104.

The active components that form the scan line driver 22 and signal line driver 23 that are arranged in the peripheral area 104 will be referred to herein as (a second type of) TFTs 30B. If the controller 24 is arranged in the peripheral area 104, the active components that form the controller 24 may also be TFTs 30B.

Figure 4:
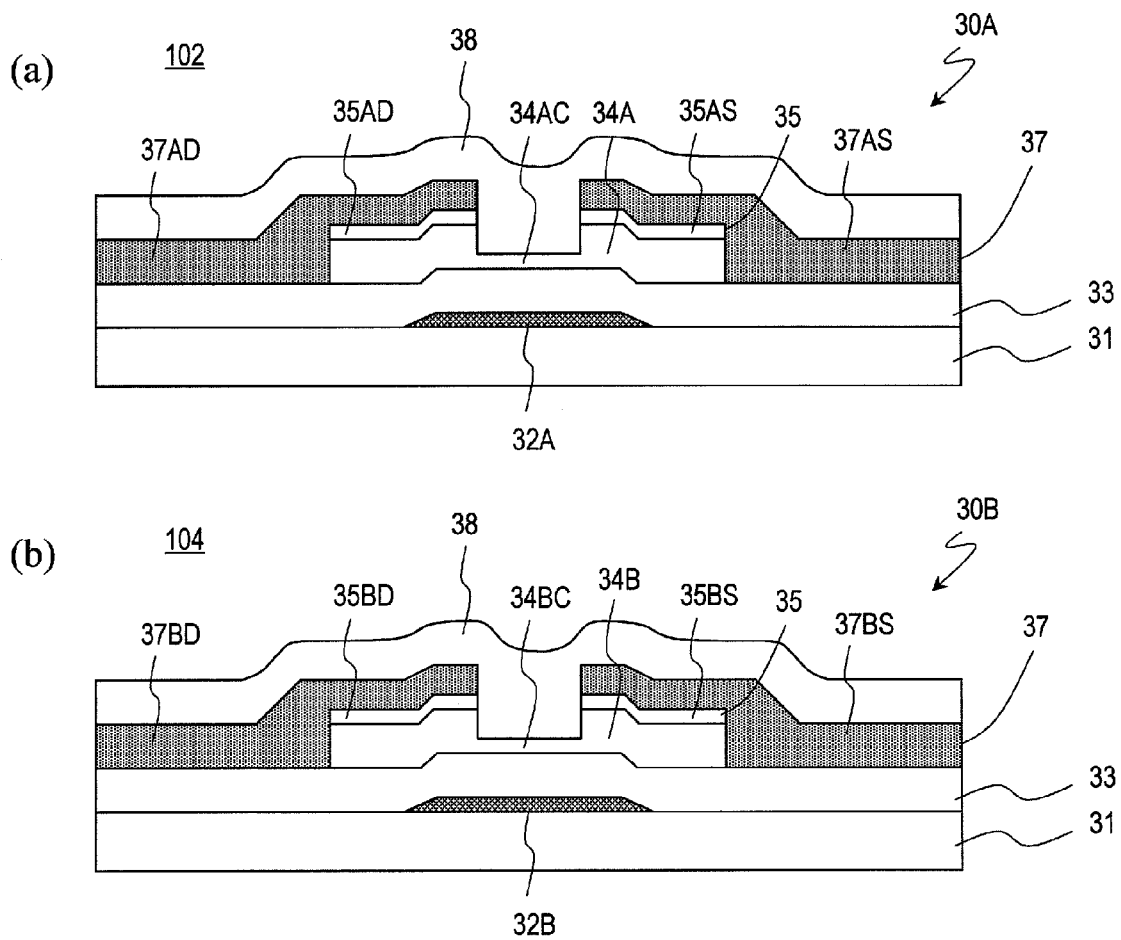
[FIGS. 4] (a) and (b) are cross-sectional views schematically illustrating the configurations of TFTs 30A and 30B in the semiconductor device 100 as an embodiment of the present invention.

FIGS. 4(a) and 4(b) are cross-sectional views schematically illustrating the configurations of the TFTs 30A and 30B, respectively, both of which are inverted-staggered thin-film transistors with a bottom gate structure. In the display area 102 of the liquid crystal display device 1, the (first type of) TFT 30A is provided for each pixel. In the peripheral area 104, on the other hand, the (second type of) TFT 30B is provided for each active component.

The TFT 30A includes a gate electrode 32A, which has been formed on a substrate 31 (and which will be referred to herein as a "first gate electrode"), a gate insulating layer 33, which has been deposited on the substrate 31 to cover the gate electrode 32A, a silicon layer 34A, which has been stacked as an active layer on the gate insulating layer (and which will be referred to herein as a "first semiconductor layer"), an N-type silicon layer 35, which has been formed on the silicon layer 34A and which has been doped with a dopant (and which will be referred to herein as a "doped semiconductor layer"), a metal layer 37, which has been deposited on the N-type silicon layer 35, and a passivation layer 38, which has been formed on the metal layer 37. The N-type silicon layer 35 may be replaced with a P-type silicon layer.

The silicon layer 34A includes a channel region 34AC, which is arranged over the gate electrode 32A (and which will be referred to herein as a "first channel layer"). The silicon layer 34A including the channel region 34AC is a microcrystalline silicon layer (which will also be referred to herein as a "nano-silicon layer" and) which has been obtained by annealing and crystallizing a portion of a layer that has been deposited as an amorphous silicon (a-Si) layer with that portion irradiated with an energy beam such as a laser beam.

It should be noted that the "microcrystalline silicon" refers herein to crystalline silicon grains, which are obtained by crystallizing a portion of amorphous silicon and which have an average crystal grain size that is smaller than that of polysilicon and less than 10 nm. In the silicon layer 34A of the TFT 30A, the microcrystalline silicon grains have an average grain size of less than 1 nm.

The source and drain regions of the TFT 30A are defined to interpose the channel region 34AC between them. And each of the N-type silicon layer 35 and the metal layer 37 has been divided into the source and drain regions. Portions of the N-type silicon layer 35 and the metal layer 37 that define the source region will be referred to herein as a "source contact layer 35AS" and a "source electrode 37AS", respectively. On the other hand, portions of the N-type silicon layer 35 and the metal layer 37 that define the drain region will be referred to herein as a "drain contact layer 35AD" and a "drain electrode 37AD", respectively.

The TFT 30B includes a gate electrode 32B, which has been formed on the substrate 31 (and which will be referred to herein as a "second gate electrode"), a gate insulating layer 33, which has been deposited on the substrate 31 to cover the gate electrode 32B, a silicon layer 34B, which has been stacked as an active layer on the gate insulating layer 33 (and which will be referred to herein as a "second semiconductor layer"), an N-type silicon layer 35, which has been formed on the silicon layer 34B, a metal layer 37, which has been deposited on the N-type silicon layer 35, and a passivation layer 38, which has been formed on the metal layer 37.

The silicon layer 34B includes a channel region 34BC, which is arranged over the gate electrode 32B (and which will be referred to herein as a "second channel layer"). The silicon layer 34B including the channel region 34BC is a microcrystalline silicon layer which has been obtained by annealing and crystallizing a portion of a layer that has been deposited as an amorphous silicon (a-Si) layer with that portion irradiated with an energy beam such as a laser beam. In the silicon layer 34B, the crystalline silicon grains have an average grain size of 1 nm to 10 nm. Thus, the average grain size of the crystal grains included in the silicon layer 34B and channel region 34BC of the TFT 30B is larger than that of the crystal grains included in the silicon layer 34A and channel region 34AC of the TFT 30A.

By adopting such a configuration, the TFT 30A achieves a mobility of 1 to 5 $cm^2/Vs$ and an OFF-state current of about 1 pA and the TFT 30B achieves a mobility of 10 $cm^2/Vs$ or more and an OFF-state current of about 10 pA.

The source and drain regions of the TFT 30B are defined to interpose the channel region 34BC between them. And each of the N-type silicon layer 35 and the metal layer 37 has been divided into the source and drain regions. Portions of the N-type silicon layer 35 and the metal layer 37 that define the source region will be referred to herein as a "source contact layer 35BS" and a "source electrode 37BS", respectively. On the other hand, portions of the N-type silicon layer 35 and the metal layer 37 that define the drain region will be referred to herein as a "drain contact layer 35BD" and a "drain electrode 37BD", respectively.

Hereinafter, a method for fabricating the semiconductor device 100 and the TFTs 30A and 30B (which will be referred to herein as a "first manufacturing process") will be described with reference to FIGS. 5(a) through 5(d).

According to this manufacturing process, first of all, the multilayer structure shown in FIG. 5(a) is provided. That multilayer structure is obtained in the following manner.

First, a Ta (tantalum) layer, for example, is deposited on a substrate (or a transparent substrate) 31 by sputtering process and then patterned by photolithographic process, thereby forming gate electrodes 32A and 32B. In this case, the etching process may be carried out as a dry etching process by making the photoresist regress with oxygen included in the etching gas. As a result, the gate electrodes 32 come to have sloped side surfaces that define a taper angle of approximately 45 degrees with respect to the surface of the substrate.

The metal that makes the gate electrodes 32A and 32B does not have to be Ta but may also be a single metallic element such as aluminum (Al), indium tin oxide (ITO), tungsten (W), copper (Cu), chromium (Cr), molybdenum (Mo) or titanium (Ti), or a nitride or an oxide of any of these metals, or a material including any other metal. Optionally, each of these gate electrodes 32A and 32B may also be a stack of multiple layers that are made of any arbitrary combination of these materials.

The metal layer that makes the gate electrodes 32A and 32B does not have to be deposited by sputtering process but may also be formed by evaporation process as well. The gate metal film does not have to be etched by the method described above, either, but may also be etched by a dry etching process that uses a chorine ($Cl_2$) gas, a boron trichloride ($BCl_3$) gas and a carbon tetrafluoride ($CF_4$) gas in combination.

Next, a silicon nitride ($SiN_x$) film to be the gate insulating layer 33 is deposited by plasma CVD (chemical vapor deposition) process, and an amorphous silicon layer 34 is deposited thereon. These films may be deposited continuously by performing a plasma CVD process using a multi-chamber system. The amorphous silicon layer 34 may have a thickness of 30 nm, for example, and its thickness had better fall within the range of 20 nm to 100 nm.

Thereafter, the amorphous silicon layer 34 is subjected to a dehydrogenation process at a temperature of 250° C. to 400° C. and then irradiated with laser beams 52A and 52B using an excimer laser diode, for example, thereby turning the amorphous silicon layer into a microcrystalline silicon layer. In this process step, the laser beam 52A is directed toward the display area 102 and the laser beam 52B is directed toward the peripheral area 104.

The quantity of the energy that is applied to a unit area (1 $cm^2$) of the peripheral area 104 by irradiating that area with the laser beam 52B (which will be referred to herein as a "second quantity") is larger than that of the energy that is applied to a unit area (1 $cm^2$) of the display area 102 by irradiating that area with the laser beam 52A (which will be referred to herein as a "first quantity"). Their difference may be within the range of 40 $mJ/cm^2$ to 150 $mJ/cm^2$, for example. The quantity of the energy that is applied to the unit area by irradiating that area with the laser beam 52A may be 220 $mJ/cm^2$ to 260 $mJ/cm^2$. On the other hand, the quantity of the energy that is applied to the unit area by irradiating that area with the laser beam 52B may be 330 $mJ/cm^2$ to 360 $mJ/cm^2$.

By applying such energies, the entire amorphous silicon layer 34 can turn into microcrystalline silicon. In the rest of the manufacturing process, the amorphous silicon layer 34 that has turned into microcrystalline silicon will be referred to herein as a "silicon layer 34".

In this manner, the microcrystalline silicon in the display area 102 can have an average crystal grain size of less than 1 nm and the microcrystalline silicon in the peripheral area 104 can have an average crystal grain size of 1 nm to 10 nm.

Next, as shown in FIG. 5(b), an N-type silicon layer 35, which is an amorphous silicon layer that has been doped with a dopant such as phosphorus, is deposited by plasma CVD process on the silicon layer 34 that has turned into microcrystalline silicon. The N-type silicon layer 35 may have a thickness of 50 nm to 200 nm. In this process step, the N-type silicon layer 35 is formed either by introducing the dopant into the amorphous silicon that has already been deposited or by introducing the dopant before or while the amorphous silicon is deposited.

Thereafter, the N-type silicon layer 35 and the silicon layer 34 are patterned by photolithographic process, thereby obtaining N-type silicon layers 35A and 35B and silicon layers 34A and 35B with the shapes shown in FIG. 5(c).

Subsequently, a metal layer is deposited over the N-type silicon layers 35A and 35B by sputtering process. The metal to deposit may be the same as the metal of the gate electrodes. And the metal layer may have a thickness of about 80 nm to about 400 nm. After that, a resist is deposited on the metal layer, and the metal layer is wet-etched using the resist as a mask, thereby patterning the metal layer. In this patterning process step, the N-type silicon layers 35A and 35B and the silicon layers 34A and 34B that are located over the gate electrodes 32A and 32B are also etched. As a result, a structure with the shape shown in FIG. 5(d) can be obtained.

By performing this process step, a channel region 34AC with a thickness of 50 nm or less is defined in a portion of the silicon layer 34A that is located over the gate electrode 32A. In addition, a source contact layer 35AS and a drain contact layer 35AD are formed so as to interpose the channel region 34AC between them. And a source electrode 37AS and a drain electrode 37AD are formed over the source contact layer 35AS and the drain contact layer 35AD, respectively.

In the meantime, a channel region 34BC with a thickness of 50 nm or less is defined in a portion of the silicon layer 34B that is located over the gate electrode 32B. In addition, a source contact layer 35BS and a drain contact layer 35BD are formed so as to interpose the channel region 34BC between them. And a source electrode 37BS and a drain electrode 37BD are formed over the source contact layer 35BS and the drain contact layer 35BD, respectively.

Thereafter, silicon nitride is deposited by plasma CVD process over the source electrodes 37AS and 37BS, the drain electrodes 37AD and 37BD and the channel regions 34AC and 34BC, thereby forming a passivation film 38. In this manner, the TFTs 30A and 30B shown in FIGS. 4(a) and 4(b) are completed. After the silicon nitride has been deposited, the channel layers (including the silicon layers 34A and 34B of the channel regions 34AC and 34BC) are subjected to a heat treatment and hydrogenation process.

Hereinafter, the characteristics of the TFTs 30A and 30B will be described with reference to FIGS. 6 through 8.

Figure 6:
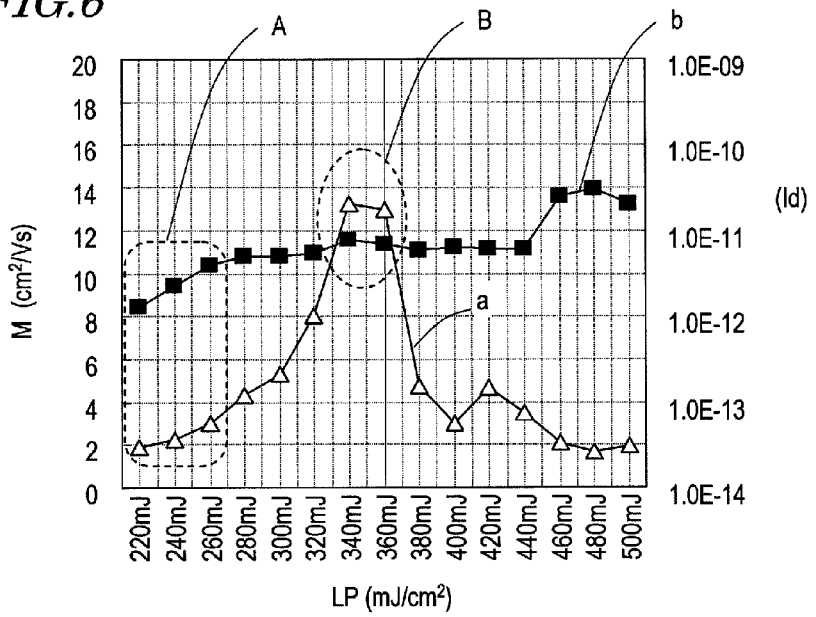
[FIG. 6] A graph showing the characteristics of the TFTs 30A and 30B.

FIG. 6 shows how the mobility M and the OFF-state current Id change with the intensity LP of the laser beam radiated in the laser beam radiating process step described above (which is represented by the energy applied to a unit area of 1 $cm^2$ of the surface). In FIG. 6, the graph a shows the relation between the intensity of the laser beam and the mobility M, while the graph b shows the relation between the intensity of the laser beam and the OFF-state current Id. Also, in FIG. 6, the ranges A and B represent the characteristics of the TFTs 30A and 30B, respectively.

As can be seen from FIG. 6, if the intensity of the laser beam falls within the range of 220 $mJ/cm^2$ to 260 $mJ/cm^2$, the channel layer has a relatively low mobility of 1 $cm^2/Vs$ to 5 $cm^2/Vs$. On the other hand, if the intensity of the laser beam falls within the range of 330 $mJ/cm^2$ to 360 $mJ/cm^2$, the channel layer has a relatively high mobility of 10 $cm^2/Vs$ or more. The value of the OFF-state current Id remains the same in both of these cases.

In fabricating the TFT 30A in the display area 102, the amorphous silicon layer 34 is irradiated with a laser beam with an intensity of 220 $mJ/cm^2$ to 260 $mJ/cm^2$, thereby forming the channel layer 34AC. On the other hand, in fabricating the TFT 30B in the peripheral area 104, the amorphous silicon layer 34 is irradiated with a laser beam with an intensity of 330 $mJ/cm^2$ to 360 $mJ/cm^2$, thereby forming the channel layer 34BC. As a result, the TFT 30B in the peripheral area 104 can have a higher mobility than the TFT 30A in the display area 102, and the amounts of OFF-state current flowing through these two areas can be substantially the same.

Figure 7:
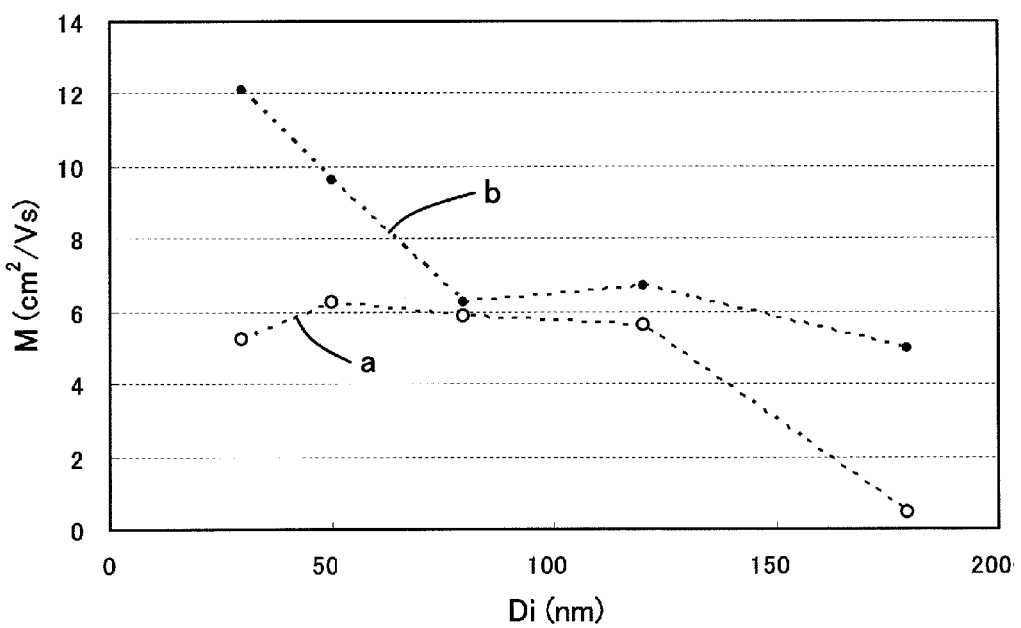
[FIG. 7] A graph showing the characteristics of the TFTs 30A and 30B.

FIG. 7 shows how the mobility M changes with the thickness Di of the silicon layers 34A and 34B. In FIG. 7, the graph a indicates their relation in a situation where the laser beam has an intensity of 240 $mJ/cm^2$ and the graph b indicates their relation in a situation where the laser beam has an intensity of 280 $mJ/cm^2$.

As can be seen from FIG. 7, if the silicon layers 34A and 34B have a thickness Di of 150 nm or less, the mobility M can be as high as about 3 $cm^2/Vs$ or more, no matter whether the intensity of the laser beam is 240 $mJ/cm^2$ or 280 $mJ/cm^2$. However, if the thickness Di is greater than 150 nm and if the laser beam has an intensity of 240 $mJ/cm^2$, the mobility M can be no more than 3 $cm^2/Vs$. That is why to achieve a high mobility M of 3 $cm^2/Vs$ or more irrespective of the intensity of the laser beam, the silicon layers 34A and 34B need to have a thickness Di of 150 nm or less.

Figure 8:
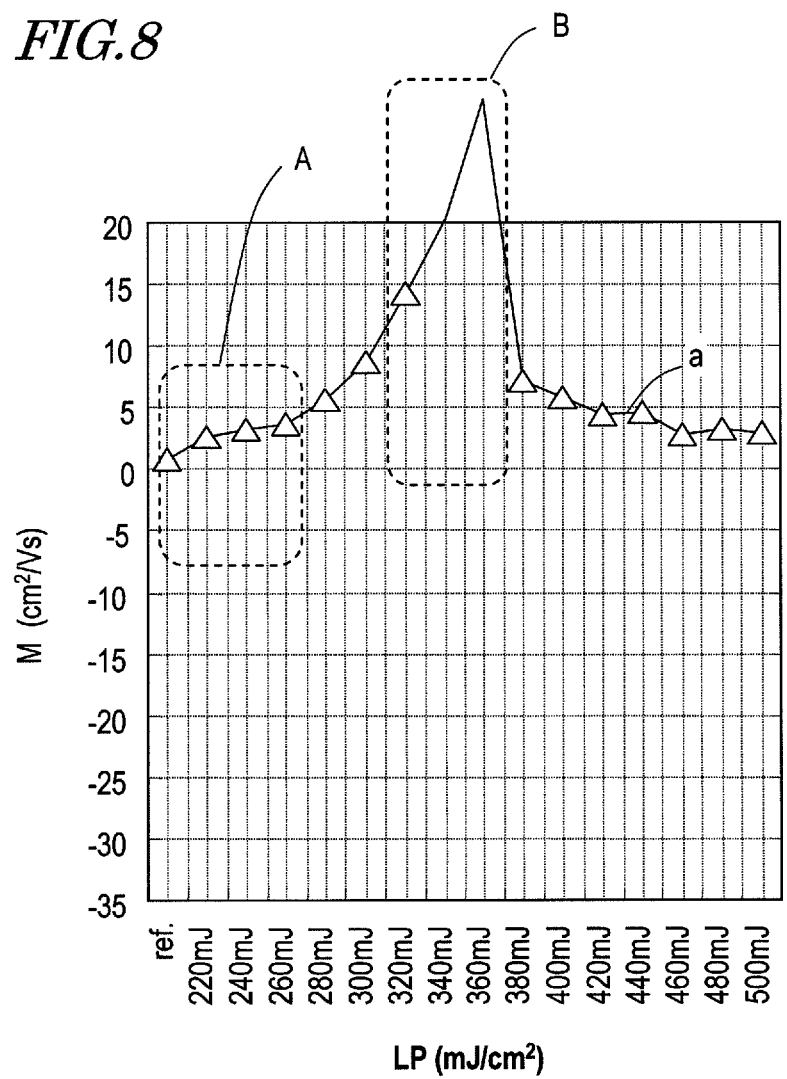
[FIG. 8] A graph showing the characteristics of the TFTs 30A and 30B.

FIG. 8 shows how the mobility M changes with the intensity LP of the laser beam in a situation where the channel regions 34AC and 34BC of the TFTs 30A and 30B have been defined under a different condition from the TFTs 30A and 30B with the characteristic shown in FIG. 6. In FIG. 8, the graph a indicates the relation between the intensity LP of the laser beam and the mobility M. Also, the ranges A and B shown in FIG. 8 represent the characteristics of the TFTs 30A and 30B, respectively.

As can be seen from FIG. 8, if the laser beam has an intensity of 220 $mJ/cm^2$ to 260 $mJ/cm^2$, the channel layer has a relatively low mobility of 1 $cm^2/Vs$ to 5 $cm^2/Vs$. On the other hand, if the laser beam has an intensity of 330 $mJ/cm^2$ to 360 $mJ/cm^2$, the channel layer has a relatively high mobility of 10 $cm^2/Vs$ or more. The value of the OFF-state current Id remains the same in both of these cases. Consequently, the TFT 30B in the peripheral area 104 comes to have higher mobility than the TFT 30A in the display area 102 and substantially the same amount of OFF-state current flows through these two areas.

(Embodiment 2)

Next, a second embodiment of a liquid crystal display device 1, semiconductor device 100 and TFTs 30C and 30D according to the present invention will be described. In the liquid crystal display device 1 and semiconductor device 100 of this second embodiment, the TFTs 30A and 30B of the liquid crystal display device 1 and semiconductor device 100 of the first embodiment are just replaced with TFTs 30C and 30D, respectively. In the other respects, this second embodiment has the same configuration as the first embodiment shown in FIGS. 1 to 3. Thus, the configurations of the liquid crystal display device 1 and semiconductor device 100 will not be described all over again for this embodiment.

Figure 9:
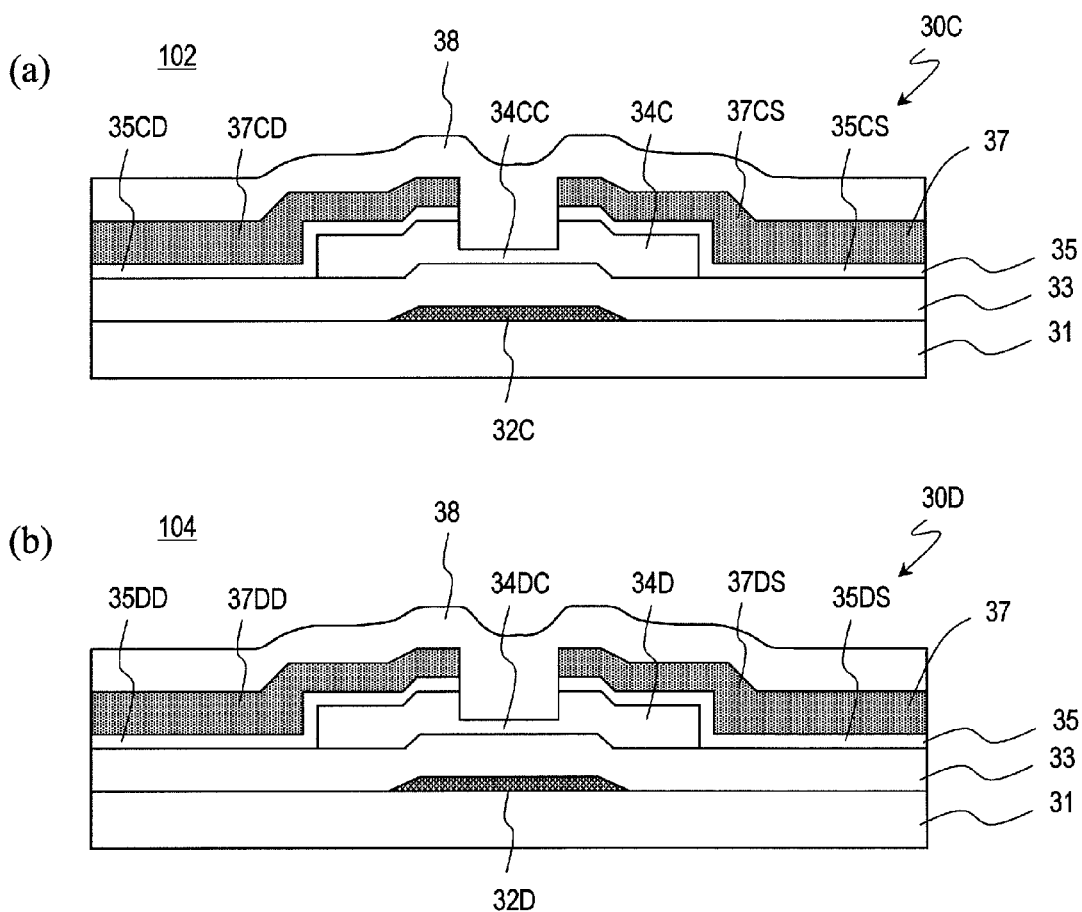
[FIGS. 9] (a) and (b) are cross-sectional views schematically illustrating the configurations of TFTs 30C and 30D in the semiconductor device 100 as a second embodiment of the present invention.

FIGS. 9(a) and 9(b) are cross-sectional views schematically illustrating the configurations of the TFTs 30C and 30D, respectively, both of which are inverted-staggered thin-film transistors with a bottom gate structure as shown in FIGS. 9(a) and 9(b).

The TFT 30C includes a gate electrode 32C, which has been formed on a substrate 31 (and which will be referred to herein as a "first gate electrode"), a gate insulating layer 33, which has been deposited on the substrate 31 to cover the gate electrode 32C, a silicon layer 34C, which has been stacked as an active layer on the gate insulating layer (and which will be referred to herein as a "first semiconductor layer"), an N-type silicon layer 35, which has been formed on the silicon layer 34C and which has been doped with a dopant (and which will be referred to herein as a "doped semiconductor layer"), a metal layer 37, which has been deposited on the N-type silicon layer 35, and a passivation layer 38, which has been formed on the metal layer 37. The N-type silicon layer 35 may be replaced with a P-type silicon layer.

The silicon layer 34C includes a channel region 34CC, which is arranged over the gate electrode 32C (and which will be referred to herein as a "first channel layer"). The channel region 34CC is a microcrystalline silicon layer which has been obtained by annealing and micro-crystallizing the silicon layer 34C that has been deposited as an amorphous silicon (a-Si) layer by being irradiated with an energy beam such as a laser beam. In the channel region 34CC, the crystalline silicon grains have an average grain size of less than 1 nm.

The source and drain regions of the TFT 30C are defined to interpose the channel region 34CC between them. And each of the N-type silicon layer 35 and the metal layer 37 has been divided into the source and drain regions. Portions of the N-type silicon layer 35 and the metal layer 37 that define the source region will be referred to herein as a "source contact layer 35CS" and a "source electrode 37CS", respectively. On the other hand, portions of the N-type silicon layer 35 and the metal layer 37 that define the drain region will be referred to herein as a "drain contact layer 35CD" and a "drain electrode 37CD", respectively.

The TFT 30D includes a gate electrode 32D, which has been formed on the substrate 31 (and which will be referred to herein as a "second gate electrode"), a gate insulating layer 33, which has been deposited on the substrate 31 to cover the gate electrode 32D, a silicon layer 34D, which has been stacked as an active layer on the gate insulating layer 33 (and which will be referred to herein as a "second semiconductor layer"), an N-type silicon layer 35, which has been formed on the silicon layer 34D, a metal layer 37, which has been deposited on the N-type silicon layer 35, and a passivation layer 38, which has been formed on the metal layer 37.

The silicon layer 34D includes a channel region 34DC, which is arranged over the gate electrode 32D (and which will be referred to herein as a "second channel layer"). The channel region 34DC is a microcrystalline silicon layer which has been obtained by annealing and micro-crystallizing the silicon layer 34D that has been deposited as an amorphous silicon (a-Si) layer by being irradiated with an energy beam such as a laser beam. In the channel region 34DC, the crystalline silicon grains have an average grain size of 1 nm to 10 nm. Thus, the average grain size of the crystal grains included in the channel region 34DC of the second TFT 30D is larger than that of the crystal grains included in the channel region 34CC of the first TFT 30C.

The source and drain regions of the TFT 30D are defined to interpose the channel region 34DC between them. And each of the N-type silicon layer 35 and the metal layer 37 has been divided into the source and drain regions. Portions of the N-type silicon layer 35 and the metal layer 37 that define the source region will be referred to herein as a "source contact layer 35DS" and a "source electrode 37DS", respectively. On the other hand, portions of the N-type silicon layer 35 and the metal layer 37 that define the drain region will be referred to herein as a "drain contact layer 35DD" and a "drain electrode 37DD", respectively.

Hereinafter, a method for fabricating the semiconductor device 100 and the TFTs 30C and 30D according to this second embodiment will be described with reference to FIGS. 10(a) through 10(e).

Figure 10:
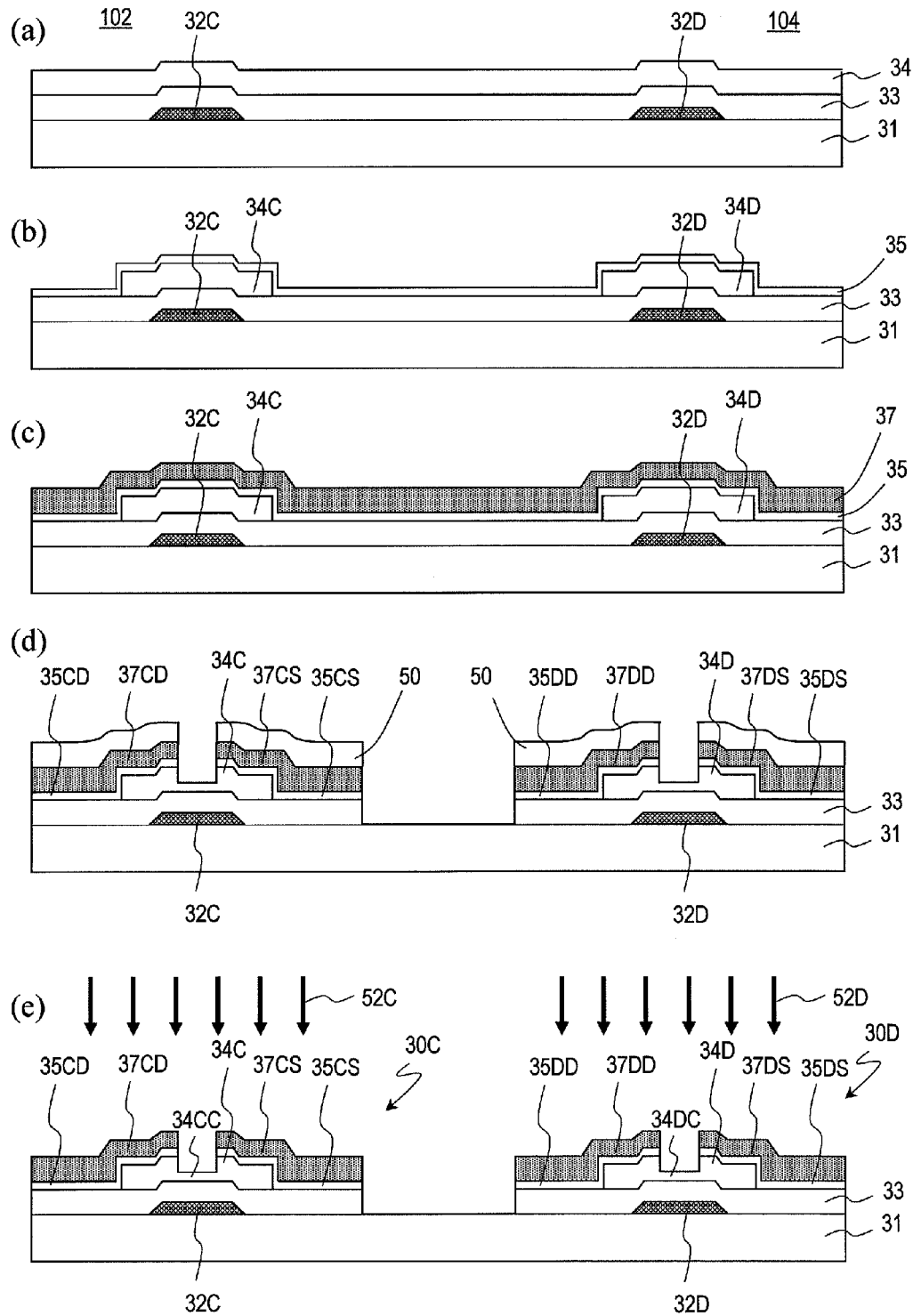
[FIGS. 10] (a) through (e) are cross-sectional views illustrating respective manufacturing process steps to fabricate the semiconductor device 100 according to the second embodiment.

In this manufacturing process, first of all, gate electrodes 32C and 32D, a gate insulating film 33 and an amorphous silicon layer 34 are formed on the substrate 31 in the same way as in the first embodiment, thereby obtaining the multilayer structure shown in FIG. 10(a).

Thereafter, the amorphous silicon layer is patterned by photolithographic process, thereby obtaining silicon layers 34C and 34D with the shapes shown in FIG. 10(b). Next, an N-type silicon layer 35 doped with a dopant such as phosphorus is deposited over the silicon layers 34C and 34D by plasma CVD process. In this process step, the N-type silicon layer 35 is formed either by introducing the dopant into the silicon that has already been deposited or by introducing the dopant before or while the silicon layer is deposited.

Subsequently, a metal layer 37 is deposited over the N-type silicon layer 35 by sputtering process, thereby obtaining the multilayer structure shown in FIG. 10(c). The metal layer 37 may be made of the same material as what is used in the first embodiment.

Next, a resist 50 is deposited on the metal layer 37 and a wet etching process is carried out using the resist 50 as a mask, thereby patterning the metal layer 37, the N-type silicon layer 35 and the silicon layers 34C and 34D. As a result, as shown in FIG. 10(d), the source and drain electrodes 37CS and 37CD of the TFT 30C and the source and drain electrodes 37D and 37D of the TFT 30D are formed out of the metal layer 37. And the source and drain contact layers 35CS and 35CD of the TFT 30C and the source and drain contact layers 35DS and 35DD of the TFT 30D are formed out of the N-type silicon layer 35. At the same time, the respective center portions (gap portions) of the silicon layers 34C and 34D are removed. As a result, a portion with a thickness of 20 to 100 nm to be a channel region is left at the center of the silicon layers 34C and 34D. That channel region had better have a thickness of 50 nm or less.

Thereafter, the resist 50 is removed and then this structure is irradiated with laser beams 52C and 52D that have been emitted from excimer laser diodes, for example, which are located over the structure (i.e., opposite from the substrate 31) as shown in FIG. 10(e). As a result, the amorphous silicon at the center of the silicon layers 34C and 34D turns into microcrystalline silicon, thereby defining channel regions 34CC and 34DC in the silicon layers 34C and 34D.

The quantity of the energy that is applied to a unit area (1 $cm^2$) of the peripheral area 104 by irradiating that area with the laser beam 52D (which will be referred to herein as a "second quantity") is larger than that of the energy that is applied to a unit area (1 $cm^2$) of the display area 102 by irradiating that area with the laser beam 52C (which will be referred to herein as a "first quantity"). Their difference may be within the range of 40 $mJ/cm^2$ to 150 $mJ/cm^2$, for example. The quantity of the energy that is applied to the unit area by irradiating that area with the laser beam 52C may be 150 $mJ/cm^2$ to 250 $mJ/cm^2$. On the other hand, the quantity of the energy that is applied to the unit area by irradiating that area with the laser beam 52D may be 190 $mJ/cm^2$ to 400 $mJ/cm^2$.

By applying the energy in this manner, the average grain size of microcrystalline silicon crystal grains included in the channel region 34DC of the TFT 30C in the peripheral area 104 becomes greater than that of crystal grains included in the channel region 34CC in the display area 102. The average grain size of crystal grains is less than 1 nm in the channel region 34CC and within the range of 1 nm to 10 nm in the channel region 34DC.

Next, the channel regions 34CC and 34DC are subjected to hydrogen plasma processing and then silicon nitride is deposited by plasma CVD process over the source electrodes 37CS and 37DS, the drain electrodes 37CD and 37DD, and the channel regions 34CC and 34DC, thereby forming a passivation layer 38. In this manner, the TFTs 30C and 30D shown in FIGS. 9(a) and 9(b) are completed.

The semiconductor device 100 of this second embodiment can also achieve the same effects as the first embodiment described above. In addition, according to the manufacturing process of this second embodiment, the semiconductor device 100 and the TFTs 30C and 30D can be fabricated efficiently by performing a smaller number of manufacturing process steps.

INDUSTRIAL APPLICABILITY

The present invention can be used effectively in any device that uses an active-matrix substrate including thin-film transistors. Examples of those devices include display devices such as a liquid crystal display device, an organic electroluminescence (EL) display device, and inorganic electroluminescence display device, image capture devices such as a flat-panel X-ray image sensor, and image input devices including close contact image sensor and a fingerprint scanner.

REFERENCE SIGNS LIST 1 liquid crystal display device
10 TFT substrate
12 pixel electrode
14 scan line
15 liquid crystal layer
16 signal line
18 storage capacitor line
20 counter substrate
22 scan line driver
23 signal line driver
24 controller 26, 27 polarizer
28 backlight unit
30A, 30B, 30C, 30D TFT
31 substrate
32A, 32B, 32C, 32D gate electrode
33 gate insulating layer
34 amorphous silicon layer
34A, 34B, 34C, 34D silicon layer (semiconductor layer)
34AC, 34BC, 34CC, 34DC channel region
35, 35A, 35B, 35C, 35D N-type silicon layer (doped semiconductor layer)
35AS, 35BS, 35CS, 35DS source contact layer
35AD, 35BD, 35CD, 35DD drain contact layer
37 metal layer
37AS, 37BS, 37CS, 37DS source electrode
37AD, 37BD, 37CD, 37DD drain electrode
38 passivation layer
50 resist
52A, 52B, 52C, 52D laser beam
100 semiconductor device (semiconductor substrate)
102 display area (pixel area)
104 peripheral area (circuit area)

The invention claimed is:

1. A semiconductor device that has first and second TFTs, the device comprising:
first and second gate electrodes that are provided for the first and second TFTs, respectively;
an insulating layer that has been formed to cover the first and second gate electrodes;
first and second semiconductor layers that have been formed on the insulating layer for the first and second TFTs, respectively;
a first source contact layer and a first drain contact layer that have been formed on the first semiconductor layer;
a second source contact layer and a second drain contact layer that have been formed on the second semiconductor layer;
a first source electrode and a first drain electrode that have been formed on the first source contact layer and the first drain contact layer, respectively; and
a second source electrode and a second drain electrode that have been formed on the second source contact layer and the second drain contact layer, respectively,
wherein the first semiconductor layer includes a first channel layer made of microcrystalline silicon and the second semiconductor layer includes a second channel layer made of microcrystalline silicon, and
wherein the crystal grains included in the first channel layer have an average grain size of less than 1 nm and the crystal grains included in the second channel layer have an average grain size of 1 nm to 10 nm.

2. A method for fabricating the semiconductor device of claim 1, the semiconductor device including first and second TFTs that have been formed in first and second areas, respectively, the method comprising the steps of:
forming the first gate electrode for the first TFT and the second gate electrode for the second TFT;
depositing the insulating layer to cover the first and second gate electrodes;
forming the first and second semiconductor layers on the insulating layer; and
forming the first source contact layer and the first drain contact layer for the first TFT on the first semiconductor layer, and forming the second source contact layer and the second drain contact layer for the second TFT on the second semiconductor layer; and
forming the first source electrode and the first drain electrode of the first TFT on the first source contact layer and the first drain contact layer, respectively, and forming the second source electrode and the second drain electrode of the second TFT on the second source contact layer and the second drain contact layer, respectively; wherein
the step of forming the first and second semiconductor layers includes the steps of:
depositing an amorphous silicon layer on the insulating layer;
irradiating the amorphous silicon layer with energy, thereby obtaining a microcrystalline silicon layer; and
forming a doped semiconductor layer on the amorphous silicon layer; and
in the step of irradiating, a portion of the amorphous silicon layer in the first area is irradiated with energy that has a first quantity per unit area ($1 cm^2$), thereby forming a first microcrystalline silicon layer including the first channel layer of the first TFT, while a portion of the amorphous silicon layer in the second area is irradiated with energy that has a second quantity, which is larger than the first quantity, per unit area, thereby forming a second microcrystalline silicon layer including the second channel layer of the second TFT.

3. The method of claim 2, wherein the first quantity is within the range of 220 $mJ/cm^2$ to 260 $mJ/cm^2$ and the second quantity is within the range of 330 $mJ/cm^2$ to 360 $mJ/cm^2$.

4. The method of claim 2, wherein the step of irradiating includes forming the first microcrystalline silicon layer that has a mobility of 1 $cm^2/Vs$ to 5 $cm^2/Vs$ and the second microcrystalline silicon layer that has a mobility of 10 $cm^2/Vs$ or more.

5. The method of claim 2, wherein the step of irradiating includes irradiating the amorphous silicon layer with energy so that the average grain size of crystal grains included in the second microcrystalline silicon layer becomes larger than the average grain size of crystal grains included in the first microcrystalline silicon layer.

6. The method of claim 5, wherein the step of irradiating includes irradiating the amorphous silicon layer with energy so that crystal grains included in the first microcrystalline silicon layer have an average grain size of less than 1 nm and that crystal grains included in the second microcrystalline silicon layer have an average grain size of 1 nm to 10 nm.

7. The method of claim 2, wherein the step of forming the first and second semiconductor layers includes respectively defining the first and second channel layers with a thickness of 50 nm or less for the first and second TFTs.

8. The method of claim 2, wherein the amorphous silicon layer has a thickness of 150 nm or less.

9. The method of claim 2, wherein the step of forming the first and second semiconductor layers includes, after the step of irradiating, the steps of: depositing a second amorphous silicon layer on the microcrystalline silicon layer; and forming the doped semiconductor layer on the second amorphous silicon layer.

10. The method of claim 2, wherein the step of irradiating includes irradiating respective portions of the amorphous silicon layer in the first and second areas with a laser beam as the energy.

11. The method of claim 2, wherein the first area is a display area including a number of pixels and the second area is a peripheral area that surrounds the display area and that includes a semiconductor circuit, and wherein the first TFT is provided as a TFT for one of the pixels in the display area and the second TFT is provided as a TFT for the semiconductor circuit in the peripheral area.

12. The semiconductor device of claim 1, wherein the first channel layer has a mobility of 1 cm$^2$/Vs to 5 cm$^2$/Vs and the second channel layer has a mobility of 10 cm$^2$/Vs or more.

13. The semiconductor device of claim 1, wherein the channel layers included in the first and second semiconductor layers have a thickness of 50 nm or less.

14. The semiconductor device of claim 1, wherein the first and second semiconductor layers have a thickness of 150 nm or less.

15. The semiconductor device of claim 1, wherein the semiconductor device has a display area including a number of pixels and a peripheral area that surrounds the display area and that includes a semiconductor circuit, and
wherein the first TFT is provided as a TFT for one of the pixels in the display area and the second TFT is provided as a TFT for the semiconductor circuit in the peripheral area.

16. A display device including the semiconductor device of claim 1.

17. The semiconductor device of claim 1, wherein the first and second semiconductor layers are microcrystalline silicon layers, and the first and second source contact layers and the first and second drain contact layers are amorphous silicon layers.

* * * * *